United States Patent [19]
Lietar

[11] Patent Number: 5,140,185
[45] Date of Patent: Aug. 18, 1992

[54] INTEGRATABLE BIPOLAR LEVEL DETECTOR FOR HIGH-FREQUENCY SINUSOIDAL SIGNALS

[75] Inventor: Loic Lietar, Milan, Italy

[73] Assignee: SGS-Thomson Microelectronics s.r.l., Agrate Brianza, Italy

[21] Appl. No.: 436,777

[22] Filed: Nov. 15, 1989

[30] Foreign Application Priority Data

Nov. 24, 1988 [IT] Italy ................................ 22718 A/88

[51] Int. Cl.$^5$ ..................... H03K 5/153; H03K 17/56; H03K 5/22; H03L 5/00
[52] U.S. Cl. .................................... 307/350; 307/264; 307/246; 307/494
[58] Field of Search ............... 307/270, 494, 246, 254, 307/350, 264, 602

[56] References Cited

U.S. PATENT DOCUMENTS 4,801,827 1/1989 Metz ................................ 307/602

Primary Examiner—John S. Heyman
Assistant Examiner—Trong Phan
Attorney, Agent, or Firm—Sixbey, Friedman, Leedom & Ferguson

[57] ABSTRACT

The level detector comprises a first capacitance having a charge circuit including a first transistor controlled by the input signal to be detected (Vi) and a discharge circuit. A second capacitance has a charge circuit including a second transistor controlled by the input signal and a discharge circuit having at least one third transistor having pre-set electrical and geometrical characteristics. The above discharge circuits are connected to the respective inputs of a comparator whose output is representative of the difference between the maximum amplitude of the input signal and a reference level depending on said electrical and geometrical characteristics of said third transistor.

4 Claims, 2 Drawing Sheets

INTEGRATABLE BIPOLAR LEVEL DETECTOR FOR HIGH-FREQUENCY SINUSOIDAL SIGNALS

FIELD OF THE INVENTION

The present invention relates to a level detector of the integratable bipolar type for high-frequency sinusoidal signals.

DESCRIPTION OF THE RELATED ART

It is known that at the upper-limit high frequencies of any bipolar technology the level of signals inside an integrated circuit accomplished with this technology is low, generally of the order of a few KT/q, and accurate amplification is impossible.

A level detector of the integratable bipolar type must therefore have a high sensitivity so as to be able to signal accurately whether a signal has an amplitude which is higher or lower than that of a reference signal.

A known level detector for sinusoidal signals is based on the use of an input amplifier, whose output controls a transistor in the charge circuit of a capacitance, whose charge voltage is compared to a reference voltage.

A detector of this type is only sensitive if the gain of the input amplifier is high. However, a high gain is not obtainable at high frequencies with the bipolar technology.

SUMMARY OF THE INVENTION

In view of this state of the art, the object of the present invention has been to accomplish a level detector of the integratable bipolar type for sinusoidal signals, with high sensitivity at high frequencies.

According to the invention such object has been attained with a level detector comprising a first capacitance having a charge circuit including a first transistor controlled by the input signal to be detected and a discharge circuit, characterized in that it also includes a second capacitance having a charge circuit including a second transistor controlled by said input signal and a discharge circuit including at least one third transistor with pre-set electrical and geometrical characteristics, said discharge circuits being connected to respective inputs of a comparator to define, respectively, a first input current corresponding to the maximum amplitude of said input signal and a second input current corresponding to a reference value depending on said geometrical and electrical characteristics of said third transistor, so that each overshooting of said reference level on the part of said maximum amplitude determines an imbalance of said comparator for the production of a corresponding output signal.

The level detector according to the present invention does not provide for a high-gain input amplifier, while it obtains its high-sensitivity characteristics from a reference level which may be defined with a high degree of accuracy by an appropriate choice of the electrical and geometrical characteristics of the detector's internal circuit components. The detector may thus also exhibit high sensitivity at high frequencies.

BRIEF DESCRIPTION OF THE DRAWINGS

Possible embodiments of the present invention are illustrated for greater clarity, but with no limiting intent, in the enclosed drawings, wherein.

DESCRIPTION OF THE PREFERRED EMBODIMENTS

Figure 1:
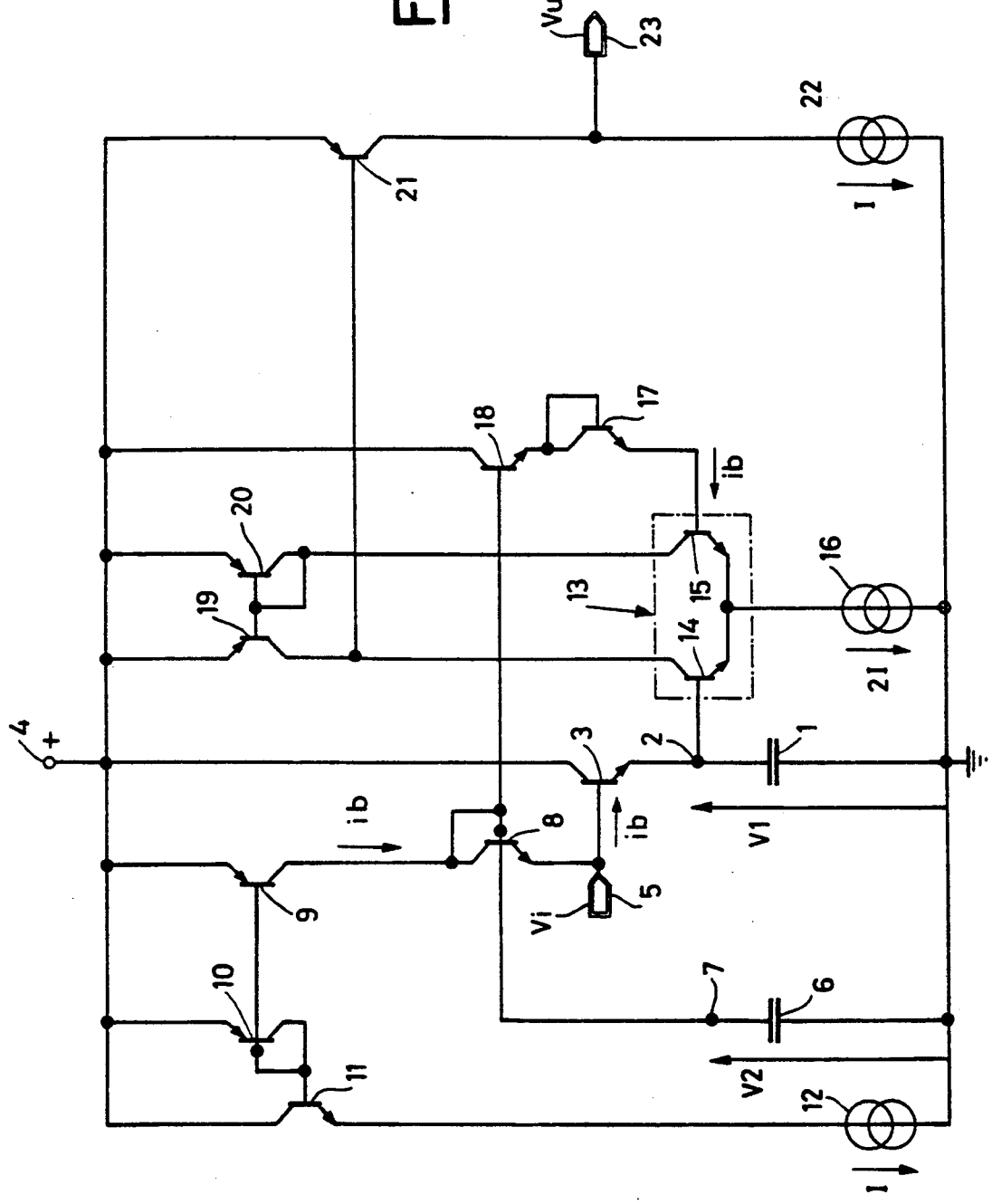
FIG. 1 shows a first example of an embodiment of the level detector according to the present invention.

The level indicator of FIG. 1 includes a first capacitance 1 connected between ground and a circuit branch point 2 connected to the emitter of an NPN transistor 3, whose collector is connected to a positive power supply terminal 4 with the base connected to an input terminal 5 for the sinusoidal signal to be detected (Vi).

A second capacitance 6 is connected between ground and a circuit branch point 7 connected to the base of an NPN transistor 8, whose emitter is connected to the input terminal 5 while the collector is connected to the base of the same transistor 8 and to the collector of a PNP transistor 9, whose emitter is connected to the positive terminal 4. The base of transistor 9 is connected to the base of another PNP transistor 10, whose emitter is connected to the positive terminal 4 while the collector is connected to the base of the same transistor 10 and to the base of an NPN transistor 11, whose collector is connected to the positive terminal 4 while its emitter is connected to ground by means of a current generator 12.

A comparator 13, formed by two NPN transistors 14 and 15 whose common emitter is connected to ground by means of a current generator 16, has an input, represented by the base of the transistor 14, connected to the circuit branch point 2 and another input, represented by the base of transistor 15, connected to the circuit branch point 7 by means of two NPN transistors 17 and 18, of which the first has the emitter connected to the base of the transistor 15 and the collector connected to the base of the same transistor 17 and to the emitter of transistor 18, whose collector is in turn connected to the positive terminal 4 and whose base is connected to the circuit branch point 7.

The collectors of transistors 14 and 15 are connected to the collectors of respective PNP transistors 19 and 20 connected with a common base and emitters connected to the positive terminal 4. The collector of transistor 20 is connected to the base of the same transistor 20, while the collector of transistor 19 is connected to the base of a PNP transistor 21, whose emitter is connected to the positive terminal 4 and the collector is connected to ground by means of a current generator 22. The collector of transistor 21 is, moreover, connected to an output terminal 23, on which the output signal Vu is available.

During operations, when a high-frequency sinusoidal signal Vi is applied to the input terminal 5, during each positive half-wave of the signal, transistor 3 charges capacitance 1 to a voltage V1 equal to the maximum value of the input signal minus the base-emitter voltage (Vbe) of transistor 3. In the subsequent half-period transistor 8 in turn charges capacitance 6 to a voltage V2 equal to the minumum value of Vi plus the base-emitter voltage (Vbe) of transistor 8.

Near the balance of the differential couple 14, 15, the discharge currents of capacitances 1 and 6 are equal to one another with a value ib and the transistors 17 and 18, both of them also polarized at a current ib, translate a voltage V2 equal to 2vbe. By adjusting the geometries of transistors 17 and 18 an offset or reference level is established, which is defined with an extremely high degree of accuracy. The comparator 13 compares the amplitude of the signal Vi with this offset, giving rise to an imbalance between the two branches of the comparator itself, which originates a corresponding signal Vu across the output 23 of the level detector.

Since the reference level is established accurately, independently of the average level of the signal Vi, it is possible to obtain a high detection sensitivity. Very large capacitances are not required, so that the structure lends itself perfectly to inclusion in an integrated circuit.

If it is necessary to have a detector having a different temperature coefficient, it is possible to adjust at will the polarization current of transistor 8.

The capacitance divider parasite effect determined by capacitance 1 and by the base-emitter junction of transistor 3 on the one side and by capacitance 6 and by the base-emitter junction of transistor 8 on the other is cancelled because it acts on the couple 17, 18 in a common manner. This cancellation occurs at a level sufficient to reduce this effect to an insignificant level by using reasonable capacitances.

Figure 2:
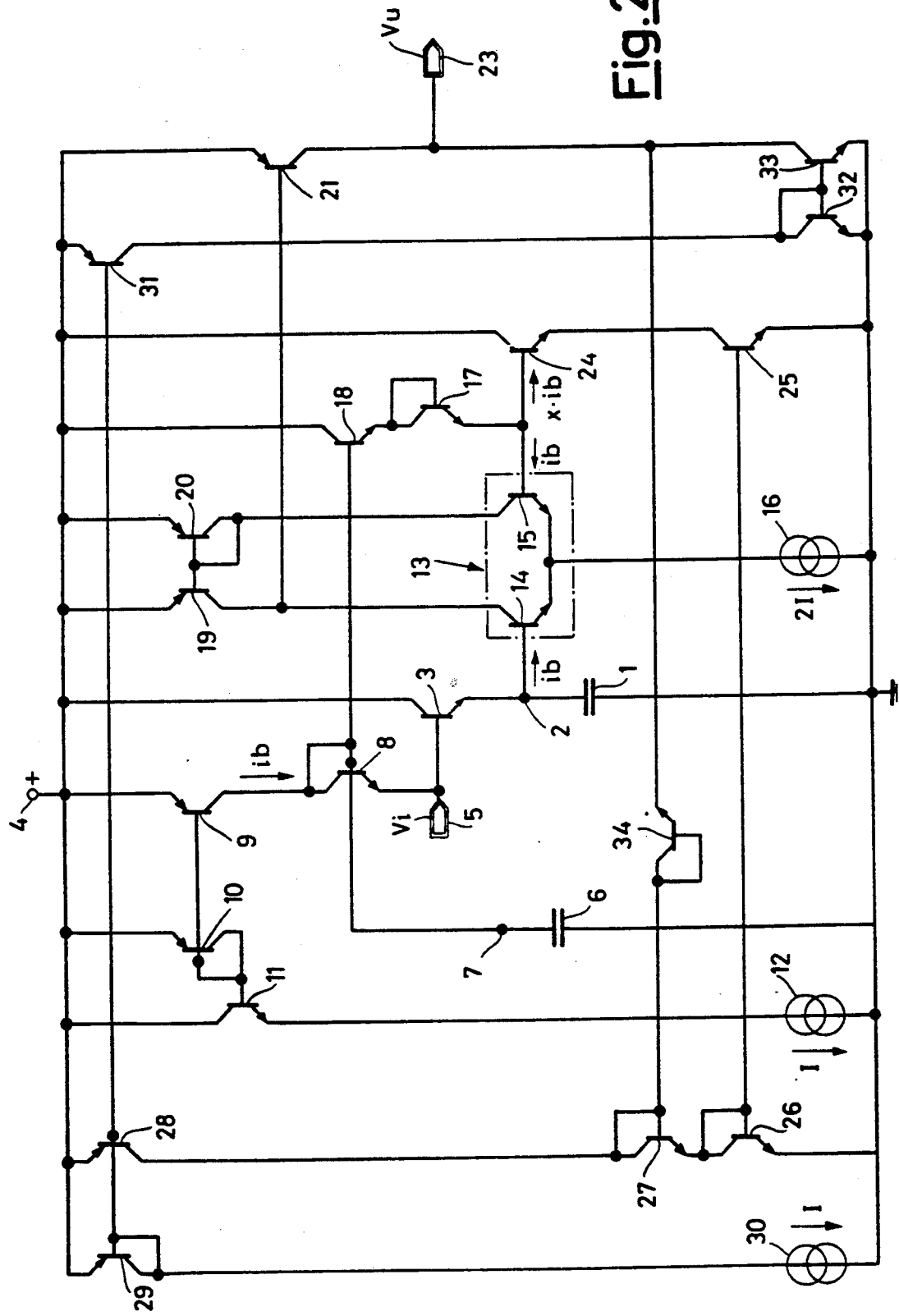
FIG. 2 shows a second example of an embodiment of the level detector according to the present invention.

Selectivity in comparing the input signal to the reference signal can be improved substantially by introducing a hysteresis of a few mV, for example as shown in FIG. 2.

Here the base of transistor 15 is also connected to the base of an NPN transistor 24, whose collector is connected to the positive terminal 4 and whose emitter is connected to the collector of an NPN transistor 25, whose emitter is connected to ground and the base connected to the base of an NPN transistor 26, whose emitter is also connected to ground. The collector of transistor 26 is connected to the base of the same transistor 26 and to the emitter of an NPN transistor 27 whose collector is connected to its base and to the collector of a PNP transistor 28, whose emitter is connected to the positive terminal 4. The base of transistor 28 is connected to the base of another PNP transistor 29, whose emitter is connected to the positive terminal 4 and whose collector is connected to the base of the same transistor 29 and to ground by means of a current generator 30. The base of transistor 28 is also connected to the base of a further PNP transistor 31, whose emitter is connected to the positive terminal 4 with its collector connected to the collector of an NPN transistor 32, whose emitter is connected to ground. The base of transistor 32 is connected to the collector of the same transistor 32 and to the base of another NPN transistor 33, whose emitter is connected to ground and whose collector is connected to the collector of transistor 21. The above collectors are also connected to the emitter of an NPN transistor 34 whose base is connected to its own collector and the latter is connected to the base of transistor 27.

The operating principle is that of reducing the offset, polarizing transistors 17 and 18 to a current $(1+x)ib$. The x.ib fraction is the base current of transistor 24 and x is established by the value of the ratio of the emitter areas of transistors 25 and 26 and by the logic level of output Vu, in the sense that they are equal to the above ratio when $Vu=1$ and are equal to zero when $Vu=0$.

More accurately, when the input voltage Vi reaches a given threshold value which, thanks to transistors 21 and 33 (the latter being controlled by transistors 32, 31 and 29), corresponds to the trigger of Vu to logic level 1, transistors 27 and 26 start to conduct, thus bringing transistors 25 and 24 to conduction. A circulation of current x.ib is thus created, which raises the current through transistors 17 and 18, so that the latter's voltage Vbe rises and the voltage Vref falls. In this way inverse commutation occurs for a lower input amplitude and no oscillations are created around the threshold amplitude.

I claim:

1. A level detector of the integratable bipolar type for high-frequency sinusoidal signals having an input and an output, comprising: a first capacitance having a charge circuit connected thereto including a first transistor controlled by an input signal connected to the input and also having a discharge circuit connected thereto, characterized in that it also includes a second capacitance having a charge circuit connected thereto including a second transistor controlled by said input signal and also having a discharge circuit connected thereto including a third transistor circuit with predetermined electrical and geometrical characteristics, said discharge circuits of said first and second capacitances each being connected to one of two respective inputs of a comparator to define, respectively, a first input current corresponding to the maximum amplitude of said input signal and a second input current corresponding to a reference level depending on said geometrical and electrical characteristics of said third transistor circuit, so that each crossing of said reference level on the part of said maximum amplitude changes the state of said comparator for the production of an output signal at the output of the detector corresponding to the relationship between the first and second input currents, characterized in that the third transistor circuit includes two transistors in series controlled by the charge voltage of said second capacitance, and wherein said third transistor circuit is connected to one of the two inputs of said comparator.

2. The level detector of claim 1, characterized in that it includes circuit means connected to the third transistor circuit for decreasing said reference level in response to the crossing of a preset threshold on the part of the detector output signal.

3. The level detector of claim 2, characterized in that said circuit means connected to the third transistor circuit includes a fourth transistor circuit connected as a circuit branch controlled by said series-connected transistors of the third transistor circuit and also connected to one of the two inputs to the comparator, and a fifth transistor circuit connected to both the output signal and the fourth transistor circuit and controlled by said detector output signal to cause said fourth transistor circuit to conduct in response to the crossing of said reference level as indicated by the detector output signal, thereby increasing the conduction current of said series-connected transistors and reducing the reference level set by said conduction current.

4. The level detector of claim 3, characterized in that said fourth transistor circuit includes two series-connected transistors, at least one of which is controlled by the third transistor circuit, and wherein the fifth transistor circuit includes two series-connected transistors, with at least one controlled by said detector output signal.

* * * * *